Feb. 27, 1962 G. STRULL 3,023,347

OSCILLATOR HAVING PREDETERMINED TEMPERATURE-FREQUENCY CHARACTERISTICS

Filed July 15, 1960 2 Sheets-Sheet 1

WITNESSES

Edwin E. Bassler

Charles L. Menzemer

INVENTOR

Gene Strull

BY

Frederick Shapoe

ATTORNEY

United States Patent Office 3,023,347

Patented Feb. 27, 1962

3,023,347

OSCILLATOR HAVING PREDETERMINED TEMPERATURE-FREQUENCY CHARACTERISTICS

Gene Strull, Pikesville, Md., assignor to Westinghouse Electric Corporation, East Pittsburgh, Pa., a corporation of Pennsylvania Filed July 15, 1960, Ser. No. 43,037
10 Claims. (Cl. 317—234)

This invention relates generally to an oscillator having predetermined temperature-frequency characteristics, and more particularly to a five-region semiconductor oscillator device, monolithic, or composed of a combination of a four-region and a two-region device having a similar region on each.

An object of the present invention is to provide a five-region, radiation-sensitive, semiconductor oscillator device having predetermined or linear temperature-frequency characteristics obtained by control of the properties of four regions and two regions thereof.

A still further object of the invention is to provide a monolithic electronic member contained within a unitary block of a semiconductor material comprising a p-n-p-n (or n-p-n-p) element electrically connected through a floating junction to an n-p (or p-n) element, the two elements being correlated so that the saturation current of the n-p element is within the negative resistance region of the p-n-p-n element, and so that the breakdown voltage of the n-p element is higher than the breakdown voltage of the four-region element, and the breakdown voltage being higher than the maximum applied voltage for the entire electronic member, the electronic member oscillating or generating pulses when energized with a potential passing through both elements, the electronic member also being radiation sensitive at either of the elements such that the frequency varies with the intensity of radiation and the point of application, the elements being correlated so that the impedance characteristics of the four region element compensate the saturation characteristics of the two region element whereby the frequency characteristics may be predetermined for the temperature of the entire device.

Another object of the present invention is to provide an n-p-n-p-n (or p-n-p-n-p) oscillator which has a substantially constant frequency of oscillation over a preselected temperature range.

Another object of the present invention is to provide an n-p-n-p-n (or p-n-p-n-p) semiconductor device comprising a unitary body of a semiconductor material which oscillates at a substantially constant frequency irrespective of changes in the temperature of the entire device over a selected range, and in which all storage and pulse forming regions are contained within the unitary body of semiconductor material.

Another object of the present invention is to provide an oscillator having predetermined temperature-frequency characteristics comprised of a four-region element and a two-region element contained within one unitary block of a semiconductor material and interconnected by a floating junction which is common to both.

Another object of the present invention is to provide an oscillator having predetermined temperature-frequency characteristics comprised of a four-region element and a two-region element contained within one unitary block of a semiconductor material, the four-region element and the two-region element having one common region and being interconnected through a floating junction.

Other objects of the present invention will, in part, appear hereinafter and will, in part, be obvious.

For a better understanding of the nature and objects of this invention, reference should be had to the following detailed descriptions and drawings, in which.

Figure 3:
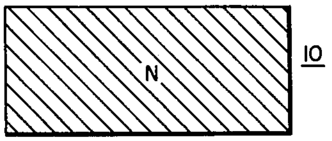
FIG. 3 is a side view, in cross-section of a wafer of semiconductor material.
Figure 8:
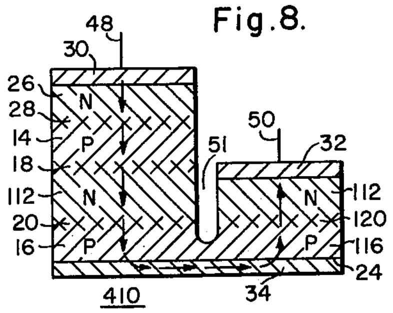
Figure 9:
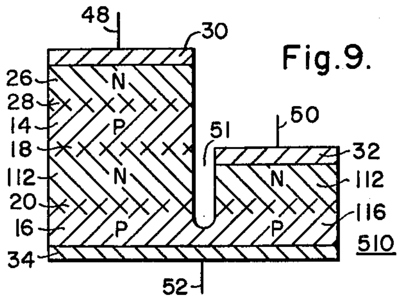
Figure 10:
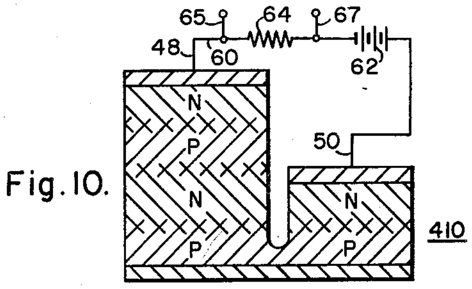
Figure 12:
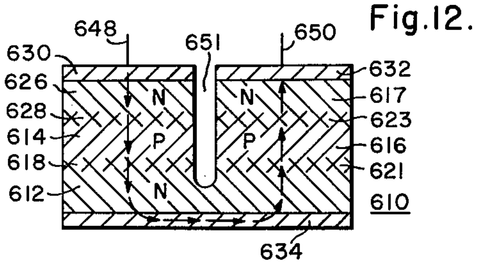
Figure 11:
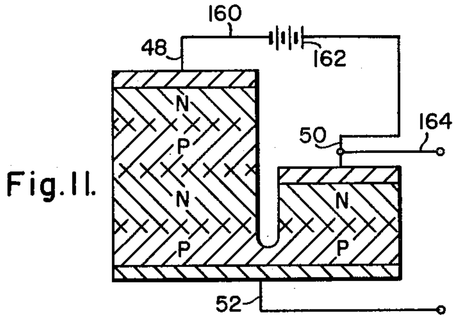
Figure 13:
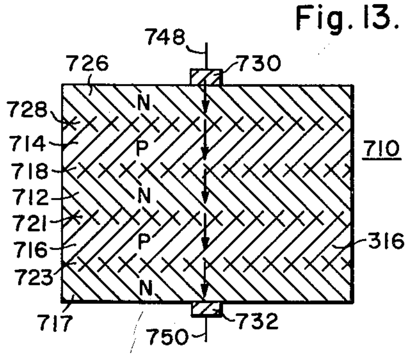
Figure 15:
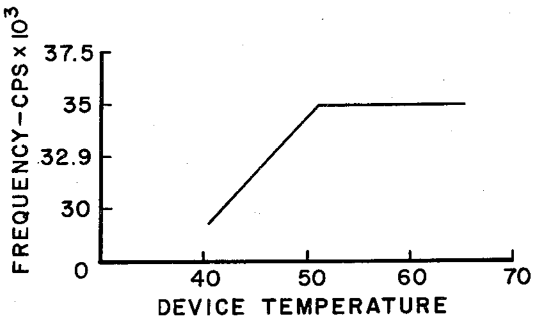
Figure 14:
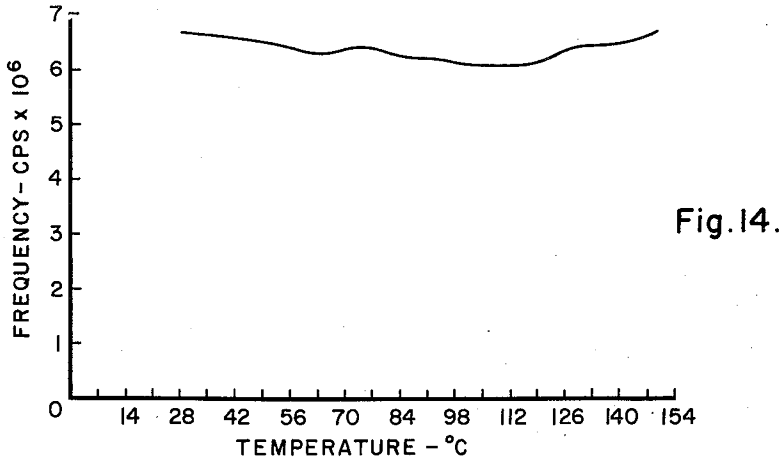

FIGS. 4 through 7 inclusive are side views, in cross-section, of the wafer of FIG. 3 undergoing various treatments in accordance with the teachings of this invention;

FIG. 8 is a side view, in cross-section of a temperature insensitive oscillating semiconductor device prepared in accordance with the teachings of this invention;

FIG. 9 is a side view, in cross-section, of the semiconductor device of FIG. 8 modified in accordance with the teachings of this invention;

FIGS. 10 and 11 are schematic circuit diagrams illustrating the use of the semiconductor device of this invention in a circuit;

FIG. 12 is a side view, in cross-section, of a temperature insensitive oscillating device prepared in accordance with the teachings of this invention;

FIG. 13 is a side view, in cross-section, of a temperature insensitive oscillating semiconductor device prepared in accordance with the teachings of this invention; and FIGS. 14 and 15 are graphs illustrating the relationship between frequency and temperature for the devices of this invention.

In accordance with the present invention and attainment of the foregoing objects; there is provided an electronic member having predetermined temperature-frequency oscillation characteristics, which device is also radiation-sensitive, said device comprising a four-region element having negative resistance properties and a two-region element which may be separate or associated within the same block of semiconductor material containing the four-region element whereby to provide a monolithic device, if the high impedance characteristics of the four-region element and the saturation characteristics of the two-region element are correlated such that they give rise to a linear frequency-temperature relationship within a selected range of temperature. If contained in one unitary block, the four-region and two-region elements may be interconnected by a floating junction, or they may be associated in a five-region member having a common region for each element, and may be of p-n-p-n-p or n-p-n-p-n configuration. The two elements forming the device are so constructed and associated that they are correlated so that the saturation current of the two-region element is within the negative resistance region of the four-region element, and so that the breakdown voltage of the two-region element is higher than the breakover voltage of the four-region element.

By proper choice of the semiconductor materials, the electrical resistivity of their regions and the physical properties of the different regions in the device, it is possible to modify and control the behavior of the oscillator with temperature. Thus, the oscillations over a selected temperature range may be substantially constant (at a constant potential) or the frequency of oscillation may be proportional to a change in temperature over a selected range. In this former case the high impedance characteristic of the four-region element is so matched to the saturation characteristic of the two-region element that they compensate each other as the temperature changes so that the net result is a substantially constant oscillation frequency.

Depending upon the semiconductor material employed, the device may be made so that it is sensitive to selected portions of a wide range of radiation from infrared through the visible spectrum to ultraviolet and even X-rays and higher frequencies. The presence of radiation will be evidenced by a change in frequency of the pulses generated when the entire device, while at a constant temperature, is energized by a given direct potential. The frequency change is proportional to the light intensity, and may be greater or less than the original frequency, depending on which element is being subjected to the radiant energy.

For the purpose of simplicity and clarity, the teachings of this invention will be set forth generally in terms of a silicon semiconductor device. It will be understood, however, that the teachings of this invention are applicable as well to devices of any semiconductor material and particularly those comprised of germanium, silicon carbide, stoichiometric compounds of elements of group III and group V of the periodic table, for example, indium arsenide, indium antimonide, gallium arsenide, and gallium antimonide, and stoichiometric compounds of group II and group VI of the periodic table, for example, cadmium sulphide. Further, two different semiconductor materials or combinations thereof, such as a germanium-silicon alloy may be employed for the device, one material for one element and another for the other, and the different semiconductor materials may be combined in one member.

Figure 1:
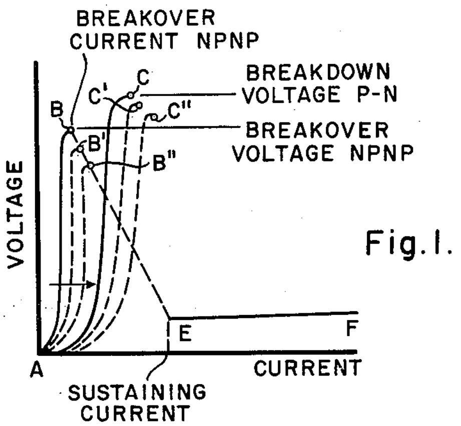
FIG. 1 is a graph of the I—V characteristics of the device of this invention.

With reference to FIG. 1, there is illustrated the I—V characteristic curve of a device of this invention wherein the frequency is constant over a selected temperature range. It will be noted that the characteristic of the four-region element, denoted by the line A—B which is the breakover current and the line E—F which is the sustaining current has a negative resistance region between the breakover current and the sustaining current lines. The saturation current of the n-p element, which is denoted by the line A—C is within this negative resistance region of the p-n-p-n element. It will be also noted that the breakdown voltage of the p-n element is higher than the breakover voltage of the p-n-p-n element. In prior art devices the oscillation frequency of such a device changes when, due to a rise in temperature, the breakover current, denoted by line A—B, moves in the direction indicated by the arrow and approaches the breakdown voltage, line A—C, of the p-n device. The changes in temperature also affect the stability of the line A—C and variations in the spacing between the lines A—B and A—C result in variations in frequency of oscillation due to temperature change. In the device of this invention as the breakover current, denoted by line A—B, moves in the direction of the arrow such that the breakover current is represented by the line A—B′ or A—B″, the breakdown voltage of the p-n device, denoted by the line A—C, moves such that the spacing between the breakover current and the breakdown voltage remains constant. That is, as the breakover current of the p-n-p-n device moves toward A—B′ the breakdown voltage of the p-n device will move to the line A—C′ and as the breakover current of the n-p-n-p device moves to line A—B″ the breakdown voltage of the p-n device will move to line A—C″. As a result of the fact that the space between the breakover current of the n-p-n-p device and the breakdown voltage of the p-n device remains substantially constant the frequency of oscillation of the device of this invention, for a constant applied voltage, remains essentially constant relative to temperature changes over a given range.

Figure 2:
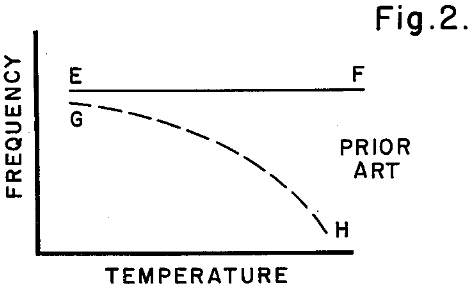
FIG. 2 is a graph showing the relationship between frequency and temperature of the device of this invention and the prior art devices.

The frequency vs. temperature relationship for a device whose output is relatively insensitive to temperature changes is illustrated in FIG. 2 by the line E—F. While the line E—F is shown as being straight, it will vary slightly from absolute uniformity for different devices. In prior art devices in which the relationship between the breakover current and the breakdown voltage is not correlated in the manner of the present invention, the frequency vs. temperature relationship is essentially that shown by the dotted line G—H. It will be noted that in prior art devices the frequency decreased markedly with an increase in temperature.

In accordance with further aspects of the invention, there may be obtained from devices of the present invention, a linear increase in frequency of oscillation with temperature rise of the device, over a given temperature range, while maintaining a constant input voltage to the device. Further, the device may be so constructed that it will have an initial linear increase in oscillation frequency for a given temperature rise to a predetermined point and thereafter the frequency will be constant for higher temperature.

With reference to FIG. 3 there is illustrated a silicon wafer 10 of n-type semiconductivity. The doped wafer 10 may be prepared by any of the methods known to those skilled in the art. For example, the doped silicon rod may be pulled from a melt comprised of silicon and at least one element from group V of the periodic table, for example, arsenic, antimony or phosphorus. The wafer 10 is then cut out from the rod with, for example, a diamond saw. The surfaces of the wafer may then be lapped or etched or both to produce a smooth surface after sawing.

The device of this invention can also be fabricated from a dendrite which has been prepared in accordance with U.S. patent application Serial No. 844,288, filed October 5, 1959, the assignee of which is the same as the present application. When prepared from a dendrite, the lapping and/or etching steps following cutting are not necessary.

The wafer 10 of FIG. 3 is masked along its side and the wafer is disposed in a diffusion furnace. The hottest zone of the furnace is of a temperature within the range of 1000° C. to 1300° C. and has an atmosphere of the vapor of an acceptor doping material, for example, indium, gallium, aluminum or boron. The zone of the furnace in which the crucible of said acceptor impurity lies may be of a temperature of from 200° C. to 1300° C., the specific temperature being selected to insure the desired vapor pressure and surface concentration of diffusant from the crucible. The acceptor impurity diffuses a selected distance into the wafer through the top and bottom surfaces.

Figure 4:
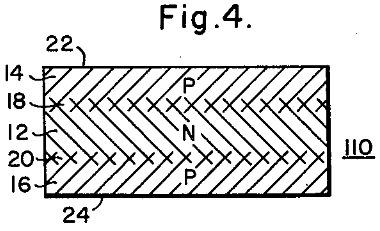

The wafer 110 illustrated in FIG. 4, is comprised of a central n-type region 12, a first p-type region 14, and a second p-type region 16. There is a p-n junction 18 between the p-type region 14 and the n-type region 12 and a p-n junction 20 between the n-type region 12 and the p-type region 16. The wafer has a top surface 22 and a bottom surface 24.

p-Type regions 14 and 16 must be deep enough to permit diffusion of additional layers of impurities therein or the affixing of contacts thereto without penetration through the p-type layer 14 or 16 to the n-type region 12. The p-type regions 14 and 16 should not be so deep, however, as to substantially increase the forward voltage drop of the finished semiconductor device. A depth or thickness of from 0.75 mil to 1.5 mils, preferably about 1 mil, for the regions 14 and 16 has been found satisfactory for the device of this invention.

Figure 5:
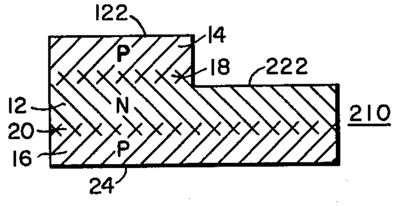

With reference to FIG. 5, approximately one-half of the top surface 22 of the wafer 110 is suitably masked or otherwise protected and the unprotected portion of the wafer is lapped and/or etched to a depth sufficient to expose a portion of the n-type region 12. The resultant wafer, denoted as 210 in FIG. 5, has a top surface portion 122 and a top surface portion 222.

Figure 6:
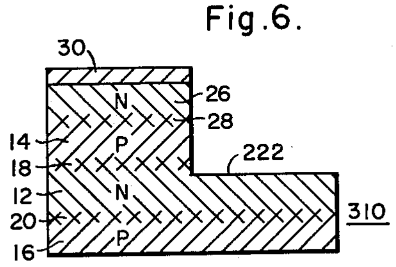

Referring to FIG. 6, region 26 of n-type semiconductivity is then formed on top surface portion 122 of the wafer 210 by disposing a donor doping material or alloy, preferably in the form of a foil or pellet 30 having a thickness of about 0.75 mil to 2 mils, and fusing the foil or pellet to the n-type region 14 by heating in a vacuum or inert atmosphere, for example, in an argon or helium atmosphere at a temperature of from 500° C. to 900° C. Care must be taken that n-type region 26 does not penetrate through p-type region 14 to n-type region 12.

Examples of suitable doping materials or alloys for producing the n-type region 26 may be comprised include arsenic, antimony, and alloys thereof, such for example as alloys of gold and antimony or arsenic. For example, a foil of an alloy comprised of 99.5% by weight, gold and 0.5% by weight, antimony is suitable.

A p-n junction 28 is formed between p-type region 14 and n-type region 26. The wafer at this stage of processing is denoted as wafer 310 in FIG. 6.

Figure 7:
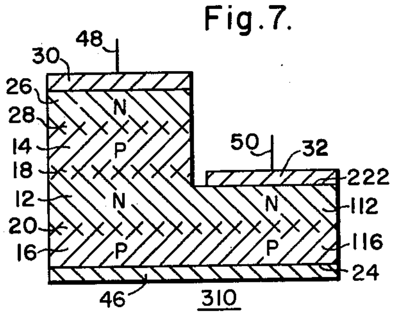

With reference to FIG. 7, metallic contacts 32 and 46 are fused to surfaces 222 and 24 of the wafer 310, respectively. The metallic contacts 32 and 46 may be comprised of a neutral metal for example gold or an alloy of a neutral metal, for example gold and a doping material capable of imparting the same type of semiconductivity as the region to which the contacts are affixed. For example, contact 32 may be comprised of gold and at least one n-type doping material such as arsenic or antimony, and contact 46 may be comprised of an alloy of gold and at least one material selected from the group consisting of boron, aluminum, gallium and indium. Electrical leads 48 and 50 may be pressure bonded or otherwise joined to the metallic contacts 30 and 32, respectively.

The wafer 310 of FIG. 7 is suitably masked with, for example, a plastic tape and a groove 51 is etched or sawed substantially across face 222 through region 112 and extending substantially into but not completely through region 116. The resulting structure is illustrated in FIG. 8. The groove 51 divides the wafer into four-region element and two-region element. It will be noted, however, from FIG. 8 that the four-region element and the two-region element have a common region, to wit regions 16 and 116.

The groove 51 may be cut into the wafer using any suitable abrasive known to those skilled in the art such as $Al_2O_3$, silicon carbide, diamond dust and the like, or a diamond saw may be used or it may be etched with any acid suitable for etching silicon.

Following the formation of the groove 51, the wafer or either the four-element or the two-element portion thereof may be etched with a suitable etchant, for example $CP_4$, to insure that the respective regions have the desired electrical characteristics. It will be noted that the structure is such that by masking, the four-region device and the two-region device may be treated separately so as to leave desired areas.

In the operation of a complete device such as that illustrated in FIG. 8, carriers introduced through the electrical lead 48 would pass through the metal contact 30, through n-type region 26, across p-n junction 28, through p-type region 14, across p-n junction 18, through n-type region 112, across p-n junction 20, through p-type region 16, into the metal contact 34, and thence along the metal contact 34 and be reflected into p-type region 116, across p-n junction 120, through n-type region 112 to metal contact 32 and thence to the metal lead 50. The path of such a carrier is denoted by the arrows in FIG. 8.

The structure of FIG. 8 is an electronic member contained within a unitary block of a semiconductor material comprising a n-p-n-p electrical element connected through a floating junction to a p-n element, the materials, areas of the regions and the electrical resistivities of the two elements being correlated so that the saturation current of the p-n element is within the negative resistance region of the n-p-n-p element and so that the breakdown voltage of the p-n element is higher than the breakover voltage of the four-region element, whereby the electronic member oscillates when energized with direct potential applied across leads 48 and 50. The electronic member also is radiation-sensitive at either of the elements such that the frequency of oscillation varies with the intensity of radiation and the point of application. The oscillatory output of the electronic member may be insensitive to changes of the temperature of the device over a selected temperature range where the cross-sectional areas of the two elements are substantially the same and the material is the same or it may vary in a predetermined manner with rise in temperature of the device when the area of the p-n element is smaller than the n-p-n-p element.

With reference to FIG. 9, a third electrical lead 52 may be pressure bonded or otherwise joined to the metal contact 34. Such an electrical lead is useful in determining the electrical characteristics of the four-region element and the two-region element separately to ascertain that the entire device has the desired characteristics set forth hereinabove. In addition, the third lead 52 may be employed to add a resistance between it and lead 50 to compensate further or for a wider temperature range, or if the oscillator is to perform some other function in an electrical circuit.

With reference to FIG. 10, the device 410 of FIG. 8 is illustrated connected in series through electrical leads 48 and 50 to a conductor 60 with a direct current power source 62 and a load 64. The pulse generated from such a system having a first frequency when the device is in darkness and a second frequency when either element of the device is illuminated by light of a given intensity. An oscilloscope (not shown) may be connected in parallel with the load by conductors 65 and 67.

With reference to FIG. 11, the device 510 of FIG. 9 is shown connected in series through electrical leads 48 and 50 with a direct current source 162 by a conductor 160 and an oscilloscope (not shown) or other frequency determining instrument is connected to lead 52 and a conductor 164 attached to lead 50. The circuit of FIG. 11 avoids the use of a separate resistance.

While the device illustrated in FIGS. 8 and 9 shows the preferred embodiment of the oscillator of this invention, it will be understood that the physical structure of the device may be modified. For example, with particular reference to FIG. 12, there is illustrated a modified oscillator device 610. The device 610 is comprised essentially of two separate elements jointed through a common region. The two elements, an n-p-n element and an n-p-n element, are separated electrically by a groove 650 but are connected electrically through a common n-type region 612 and the metal contact 634. The functioning of the four-region element is obtained by regions 626, 614, and 616 and floating region 612, and the two-region element is comprised of regions 616 and 617. Region 616 is common to both elements. In operation, the minority carriers would be introduced through an electrical lead 648, passes through a metal contact 630 and thence into the n-type region 626, across p-n junction 628, through p-type region 641, across p-n junction 618, through n-type region 612 and thence into the metal contact 634 and then be reflected again into n-type region 612, pass across the p-n junction 621 through the p-type region 616, across the p-n junction 623 and thence through n-type region 617 to metal contact 632 and pass from the device through electrical lead 651. The device of FIG. 12 will operate in essentially the same manner as the device 410 of FIG. 8.

With reference to FIGURE 13, there is illustrated a still further modification structural-wise of the oscillator device of this invention. In the operation of the device 710 of FIGURE 13, minority carriers are introduced through the electrical lead 748 and pass to the electrical metal contact 730. The carrier then passes to the n-type region 726, across the p-n junction 728 through the p-type region 714 across the p-n junction 718, through the n-type region 712, across the p-n junction 721 through the p-type region 716, across the p-n junction 723 and thence to the electrical lead 750. The device of FIG. 13 is comprised of a four-region element and a two-region element. The four-region element is comprised of regions 726, 714, 712 and 716. The two-region device is comprised of regions 716 and 717. It will be noted that region 716, a p-type region, is common to both the four-region elements and the two-region elements and comprises the means by which the four-region element and the two-region element are connected electrically in series.

It will be further understood, that the four-region element and the two-region element comprising the semiconductor device of this invention may be made from separate bodies of semiconductor materials and electrically connected in series. The four-region element may be comprised of a first semiconductor material and the two-region element of a second semiconductor material or the two elements may be comprised of the same semiconductor material.

The following example is illustrative of the practice of this invention:

*Example I*

A wafer of n-type silicon having a resistivity of .5 ohm centimeter, and being 0.2 inch in length and 0.1 inch in width and having a thickness of approximately 9 mils, was disposed in a diffusion furnace. The diffusion furnace was at a temperature of 1200° C. and had a gallium vapor atmosphere. By edge masking, the gallium was allowed to diffuse into the wafer only through its top and bottom surface to a depth of 3 mils. The wafer was then removed from the diffusion furnace. The structure is that illustrated in FIG. 4.

Approximately one-half of the top surface of the wafer was lapped to a depth of approximately 3.2 to 3.3 mils whereby the central n-type region was exposed.

Thereafter an n-type doping foil having a thickness of approximately 1 mil and a diameter of 25 mils and comprised of 99.5%, by weight gold and 0.5%, by weight antimony was disposed upon the unabraded top surface of the wafer and fused to the p-type aluminum diffused layer. Care was exercised to insure that the foil did not fuse completely through the aluminum layer. The structure is that illustrated in FIG. 6.

Metallic contacts comprised of 99.5%, by weight gold and 0.5%, by weight antimony were disposed on top of the newly formed n-type region and the top of the n-region exposed by abrading, and a metallic contact comprised of 94%, by weight aluminum and 6%, by weight, boron was disposed on the bottom surface of the wafer. The metallic contacts were fused to the wafer at a temperature of approximately 700° C. in a vacuum of approximately $10^{-5}$ mm. Hg. The structure is that illustrated in FIG. 7. The wafer was then masked with plastic tape and a groove formed in the structure by abrading with $Al_2O_3$. The groove approximately 50 mils wide was formed to a depth of approximately 4 mils and passed entirely through the n-type region and into the lower p-type region of the wafer.

The wafer was then etched with $CP_4$ etchant to clean up the areas of dislocation formed by abrading and to insure the removal of all excess metal resulting from the formation of the metal contacts. Metal electrical leads comprised of gold wire were then pressure bonded to the two metal contacts on the upper surface of the wafer. The resultant structure is that illustrated in FIG. 8 and is an oscillator which was temperature insensitive over a substantial range. It can be sensitive to radiation.

The two p-type regions had a resistivity of from approximately 0.1 to 0.2 ohm-cm. The two central n-type regions had a resistivity of approximately 0.37 to 0.5 ohm-cm. The two top n-type regions were doped to a concentration of $10^{19}$ carriers per cubic centimeter.

*Example II*

The device prepared in accordance with Example I was connected in series with a D.C. power source of 180 volts. The resultant structure was essentially that illustrated in FIG. 10. The device was exposed to radiation in the form of incandescent lighting and found to oscillate at a frequency of approximately $6.65 \times 10^5$ cycles per second at a temperature of approximately 28° C. The ambient temperature around the device was allowed to increase to approximately 150° C. and the frequency of oscillation over this temperature range established. The variation in frequency of oscillation relative to temperature change is set forth graphically in FIG. 14. It may be seen from FIG. 14 that the frequency of oscillation remained substantially constant over a temperature range of approximately 120° C.

*Example III*

The procedure of Example I was repeated to produce a semiconductor device with the same configuration as that illustrated in FIG. 8.

The two p-type regions were each 0.0015 inch thick and had a resistivity of approximately 0.6 ohm-cm. The two central n-type regions were about 4 mils thick and had a resistivity of 10 ohm-cm. The two top n-type regions were about 1 mil thick and doped to a concentration of about $10^{19}$ carriers per cubic centimeter.

When the device was connected in circuit in the manner illustrated in FIG. 10 with a voltage source of 192 volts, the device oscillated at a frequency of about $30 \times 10^3$ c.p.s. at a temperature of about 42° C. As the temperature was increased to 50° C. the frequency of oscillation increased to about $35 \times 10^3$ c.p.s. The frequency of oscillation then remained constant despite a temperature rise of about 15° C. The temperature-frequency relationship is shown graphically in FIG. 15.

It will be understood that while the preparation of the device of this invention has been set forth in a particular sequence of operations, the sequence may be changed and the materials used to form the various regions may be varied without varying from the scope of this invention.

Since certain changes in carrying out the above processes and in the product embodying the invention may be made without departing from its scope, it is intended that the accompanying description and drawings be interpreted as illustrative and not limiting.

I claim as my invention:

1. An oscillator device having predetermined temperature-frequency characteristics when a direct potential is applied thereto, the device comprising a four-region semiconductor element having a negative resistance characteristic and a two-region semiconductor element, the consecutive regions of the elements being of opposite types of semiconductivity, the two elements being so constructed that they are so correlated in that the saturation current of the two-regions element is within the negative resistance region of the four-region element, and that the breakdown voltage of the two-region element is higher than the breakover voltage of the four-region element and the high impedance characteristics of the four-region element and the saturation characteristics of the two-region element are correlated so as to give rise to a linear temperature-frequency relationship with changes in temperature.

2. An electronic member comprising within a unitary block of a semiconductor material an n-p-n-p element having a negative resistance region electrically connected to a p-n element through a floating junction, the saturation current of the p-n element being within the negative resistance region of the n-p-n-p element, said electronic member generating a pulse at a first frequency when energized with a direct current, and at another frequency when subjected to radiation upon either of the elements while being energized by said direct current, said frequency of oscillation being substantially independent of changes in the ambient temperature for a selected temperature range.

3. An electronic member comprising within a unitary block of a semiconductor material an n-p-n-p element having a negative resistance region electrically connected to a p-n element through a common region and a floating junction, the saturation current of the p-n element being within the negative resistance region of the n-p-n-p element and the breakdown voltage of the p-n element being higher than the breakover voltage of the n-p-n-p element, said electronic member generating pulses at a first frequency when energized with a direct current, and at another frequency when subjected to radiation upon either of the elements while being energized by said direct current, said frequency of oscillation being substantially independent of changes in the ambient temperature over a selected range of temperatures.

4. An electronic member comprising within a unitary block of semiconductor material an n-p-n-p element having a negative resistance region electrically connected to a p-n element through a common metallic contact, the saturation current of the p-n element being within the negative resistance region of the n-p-n-p element and the breakdown voltage of the p-n element being higher than the breakover voltage of the n-p-n-p element, said electronic member generating pulses at a first frequency when energized with a direct current, and at another frequency when subjected to radiation upon either of the elements while being energized by said direct current, said frequency of oscillation being substantially independent of changes in the ambient temperature over a selected range of temperatures.

5. An electronic member contained within a unitary block of a semiconductor material comprising, a first region having a first-type of semiconductivity, a second region having a second-type of semiconductivity, said second region being contiguous with a first predetermined portion of the top surface of said first region, a first p-n junction between said first and said second regions, a third region having the second-type of semiconductivity, said third region being contiguous with a second predetermined portion of the top surface of said first region, a second p-n junction between said first and said third regions, said second region and said third region being separated by a groove extending into said first region, a fourth region having the first type of semiconductivity, said fourth region being contiguous with the upper surface of said second region, a third p-n junction between said second region and said fourth region, a fifth region having said second type of semiconductivity, said fifth region being contiguous with the upper surface of said fourth region, a fourth p-n junction between said fourth and said fifth regions, and ohmic metallic contacts affixed to the top surfaces of said third region and said fifth region and the bottom surface of said first region.

6. An electronic member contained within a unitary block of a semiconductor material comprising, a first region having a first type of semiconductivity, a second region having a second type of semiconductivity, said second region being contiguous with a first predetermined portion of the top surface of said first region, a first p-n junction between said first and said second regions, a third region having the second type of semiconductivity, said third region being contiguous with a second predetermined portion of the top surface of said first region, the second p-n junction between said first and said third regions, said second region and said third region being separated by a groove extending into said first region, a fourth region having the first type of semiconductivity, said fourth region being contiguous with the upper surface of said second region, a third p-n junction between said second region and said fourth region, a fifth region having said second type of semiconductivity, said fifth region being contiguous with the upper surface of said fourth region, a fourth p-n junction between said fourth and said fifth regions, ohmic metallic contacts affixed to the top surfaces of said third region and said fifth region and the bottom surface of said first region, an electrical lead affixed to the ohmic metallic contacts affixed to the top surface of said third region and said fifth region.

7. An electronic member contained within a unitary block of a semiconductor material comprising, a first region having a first type of semiconductivity, a second region having a second type of semiconductivity, said second region being contiguous with a first predetermined portion of the top surface of said first region, a first p-n junction between said first and said second regions, a third region having the second type of semiconductivity, said third region being contiguous with a second predetermined portion of the top surface of said first region, a second p-n junction between said first and said third region, said second region and said third region being separated by a groove extending into said first region, the fourth region having the first type of semiconductivity, said fourth region being contiguous with the upper surface of said second region, a third p-n junction between said second region and said fourth region, a fifth region having said second type of semiconductivity, said fifth region being contiguous with the upper surface of said fourth region, a fourth p-n junction between the fourth and said fifth regions, ohmic metallic contacts affixed to the top surface of said third region and said fifth region and to the bottom surface of said first region, and electrical leads affixed to said ohmic contacts.

8. An electronic member contained within a unitary block of a semiconductor material comprising, a first region having a first type of semiconductivity, a second region having a second type of semiconductivity, said second region being contiguous with a first predetermined portion of the top surface of said first region, a first p-n junction between said first and said second region, a third region having a first type of semiconductivity, said third region being contiguous with the top surface of said second region, a second p-n junction between said second and said third regions, a fourth region having said second type of semiconductivity, said fourth region being contiguous with the second predetermined portion of the top surface of said first region, a third p-n junction between said first and said fourth region, a fifth region having said first type of semiconductivity contiguous with the upper surface of said fourth region, a fourth p-n junction between said fourth and said fifth regions, and ohmic metallic contacts affixed to the upper surfaces of said third and fifth regions and the bottom surface of said first region.

9. An electronic member contained within a unitary block of a semiconductor material comprising, a first region having a first type of semiconductivity, a second region having a second type of semiconductivity, said second region being contiguous with a first predetermined portion of the top surface of said first region, a first p-n junction between said first and said second region, a third region having the first type of semiconductivity, said third region being contiguous with the top surface of said second region, a second p-n junction between said second and said third regions, a fourth region having said second type of semiconductivity, said fourth region being contiguous with a second predetermined portion of the top surface of said first region, a third p-n junction between said first and said fourth region, a fifth region having second first type of semiconductivity contiguous with the upper surface of said fourth region, a fourth p-n junction between said fourth and said fifth regions, ohmic metallic contacts affixed to the upper surface of said third and said fifth region and bottom surface of said first region, and electrical leads affixed to the ohmic metallic contacts of the third and fifth regions.

10. An electronic member contained within a unitary block of a semiconductor material comprising, a first region having a first type of semiconductivity, a second region having a second type of semiconductivity, said second region being contiguous with a first predetermined portion of the top surface of said first region, a first p-n junction between said first and said second regions, a third region having the first type of semiconductivity, said third region being contiguous with the top surface of said second region, a second p-n junction between said second and said third regions, a fourth junction having said second type of semiconductivity, said fourth region being contiguous with a second predetermined portion of the top surface of said first region, a third p-n junction between said first and said fourth region, a fifth region having said first type of semiconductivity contiguous with the upper surface of said fourth region, a fourth p-n junction between said fourth and said fifth regions, ohmic metallic contacts affixed to the upper surfaces of said third and said fifth regions and the bottom surface of said first region, and electrical leads affixed to the ohmic metallic contacts.

References Cited in the file of this patent

UNITED STATES PATENTS

| | | |
|---|---|---|
| 2,925,501 | Weese et al. | Feb. 16, 1960 |
| 2,936,384 | White | May 10, 1960 |
| 2,951,191 | Herzog | Aug. 30, 1960 |
| 2,954,486 | Doucette et al. | Sept. 27, 1960 |
| 2,988,677 | Miller | June 13, 1961 |